United States Patent
Wu et al.

(10) Patent No.: US 11,081,445 B2
(45) Date of Patent: Aug. 3, 2021

(54) SEMICONDUCTOR DEVICE COMPRISING AIR GAPS HAVING DIFFERENT CONFIGURATIONS

(71) Applicant: TAIWAN SEMICONDUCTOR MANUFACTURING CO., LTD., Hsinchu (TW)

(72) Inventors: Yu-Bey Wu, Hsinchu (TW); Dian-Hau Chen, Hsinchu (TW); Jye-Yen Cheng, Taichung (TW); Sheng-Hsuan Wei, Taoyuan (TW); Li-Yu Lee, New Taipei (TW); Tai-Yang Wu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 45 days.

(21) Appl. No.: 16/518,430

(22) Filed: Jul. 22, 2019

(65) Prior Publication Data
US 2019/0348362 A1 Nov. 14, 2019

Related U.S. Application Data

(60) Continuation of application No. 15/851,671, filed on Dec. 21, 2017, now Pat. No. 10,361,156, which is a
(Continued)

(51) Int. Cl.
*H01L 23/48* (2006.01)
*H01L 23/528* (2006.01)
(Continued)

(52) U.S. Cl.
CPC .......... *H01L 23/528* (2013.01); *G06F 30/392* (2020.01); *H01L 21/31144* (2013.01);
(Continued)

(58) Field of Classification Search
CPC .............. H01L 23/528; H01L 23/5222; H01L 21/76802; H01L 21/76877;
(Continued)

(56) References Cited

U.S. PATENT DOCUMENTS

| 5,663,599 A | 9/1997 | Lur |
| 5,998,814 A | 12/1999 | Yamaha et al. |

(Continued)

FOREIGN PATENT DOCUMENTS

| KR | 10-2015-0078100 A | 7/2015 |
| KR | 10-2015-0116516 A | 10/2015 |
| TW | 200416909 A | 9/2004 |

OTHER PUBLICATIONS

Korean Office Action issued in corresponding Korean Application No. 10-2016-0135799, dated Mar. 9, 2018.
(Continued)

*Primary Examiner* — Caleb E Henry
(74) *Attorney, Agent, or Firm* — McDermott Will & Emery LLP

(57) ABSTRACT

A semiconductor device includes a first interlayer dielectric layer disposed over a substrate, metal wirings, a second interlayer dielectric layer disposed over the first interlayer dielectric layer and the metal wirings, a first air gap and a second air gap. The metal wirings are embedded in the first interlayer dielectric layer, and arranged with a first space or a second space between the metal wirings. The second space has a greater length than the first space. The first air gap is formed by the second interlayer dielectric layer and formed in a first area sandwiched by adjacent two metal wirings arranged with the first space. The second air gap is formed by the second interlayer dielectric layer and formed in a second area sandwiched by adjacent two metal wirings arranged with the second space therebetween. No adjacent
(Continued)

two metal wirings are arranged with a space smaller than the first space.

20 Claims, 9 Drawing Sheets

Related U.S. Application Data division of application No. 15/178,115, filed on Jun. 9, 2016, now Pat. No. 9,881,870.

(60) Provisional application No. 62/273,382, filed on Dec. 30, 2015.

(51) Int. Cl.
| | |
|---|---|
| *H01L 21/768* | (2006.01) |
| *H01L 21/311* | (2006.01) |
| *H01L 23/532* | (2006.01) |
| *H01L 23/522* | (2006.01) |
| *G06F 30/392* | (2020.01) |

(52) U.S. Cl.
CPC .... *H01L 21/7682* (2013.01); *H01L 21/76802* (2013.01); *H01L 21/76877* (2013.01); *H01L 23/5222* (2013.01); *H01L 23/5226* (2013.01); *H01L 23/5329* (2013.01)

(58) Field of Classification Search
CPC ........... H01L 21/31144; H01L 21/7682; H01L 23/5329; H01L 23/5226; H01L 21/762; H01L 21/768; H01L 23/522; H01L 21/76811; H01L 21/76813; H01L 21/76816; H01L 21/76832; H01L 21/76897; G06F 30/392
See application file for complete search history.

(56) References Cited

U.S. PATENT DOCUMENTS

| | | | |
|---|---|---|---|
| 6,197,615 | B1 | 3/2001 | Song et al. |
| 6,388,336 | B1 | 5/2002 | Venkateshwaran et al. |
| 7,094,689 | B2 * | 8/2006 | Su .................. H01L 21/7682 |
| | | | 257/E21.581 |
| 7,196,423 | B2 * | 3/2007 | Wu .................. H01L 21/7682 |
| | | | 257/758 |
| 7,754,601 | B2 * | 7/2010 | Chen ................ H01L 21/7682 |
| | | | 438/637 |
| 7,803,713 | B2 * | 9/2010 | Chen ................ H01L 21/0206 |
| | | | 438/704 |
| 8,569,163 | B2 * | 10/2013 | Sekihara ................ H01L 24/85 |
| | | | 438/617 |
| 8,581,407 | B2 | 11/2013 | Salmon |
| 8,643,159 | B2 * | 2/2014 | Wong ................ H01L 23/49548 |
| | | | 257/676 |
| 8,853,865 | B2 | 10/2014 | Narita |
| 8,946,705 | B2 | 2/2015 | Yasumura et al. |
| 8,987,063 | B2 | 3/2015 | Harata et al. |
| 2001/0042921 | A1 | 11/2001 | Mori et al. |
| 2003/0042611 | A1 | 3/2003 | Mori |
| 2003/0151149 | A1 | 8/2003 | Ichikawa |
| 2004/0256723 | A1 | 12/2004 | Akagawa et al. |
| 2006/0057834 | A1 | 3/2006 | Akagawa et al. |
| 2008/0135997 | A1 | 6/2008 | Lee et al. |
| 2008/0286959 | A1 | 11/2008 | Chia |
| 2010/0065963 | A1 | 3/2010 | Eldridge et al. |
| 2010/0181678 | A1 | 7/2010 | Edelstein et al. |
| 2010/0258955 | A1 | 10/2010 | Miyagawa et al. |
| 2010/0270686 | A1 | 10/2010 | Nakao et al. |
| 2010/0276802 | A1 | 11/2010 | Shirahama |
| 2010/0293515 | A1 | 11/2010 | Inoue et al. |
| 2011/0057299 | A1 | 3/2011 | Takata et al. |
| 2012/0001336 | A1 | 1/2012 | Zeng et al. |
| 2012/0164795 | A1 | 6/2012 | Sekihara et al. |
| 2013/0214894 | A1 | 8/2013 | Bonilla et al. |
| 2013/0264693 | A1 | 10/2013 | Wong et al. |
| 2014/0027908 | A1 | 1/2014 | Tsai et al. |
| 2014/0353822 | A1 | 12/2014 | Oyachi et al. |
| 2014/0374467 | A1 | 12/2014 | Yap et al. |
| 2015/0162277 | A1 | 6/2015 | Zhang et al. |
| 2015/0179582 | A1 | 6/2015 | Baek et al. |
| 2015/0187699 | A1 | 7/2015 | Baek et al. |
| 2015/0187729 | A1 | 7/2015 | Chew |
| 2015/0287628 | A1 | 10/2015 | You et al. |
| 2015/0287676 | A1 | 10/2015 | Rha et al. |
| 2015/0311151 | A1 | 10/2015 | Chi et al. |
| 2016/0141206 | A1 | 5/2016 | Bouche et al. |
| 2016/0240428 | A1 | 8/2016 | Tung et al. |
| 2016/0372415 | A1 | 12/2016 | Siew et al. |
| 2017/0092578 | A1 | 3/2017 | Baek et al. |

OTHER PUBLICATIONS

Office Action issued in corresponding Taiwanese Patent Application No. 105136372, dated Oct. 23, 2017.
Office Action issued U.S. Appl. No. 15/178,115, dated Apr. 19, 2017.
Notice of Allowance issued in U.S. Appl. No. 15/178,115, dated Sep. 19, 2017.
Non-Final Office Action issued in related U.S. Appl. No. 15/851,671, dated Sep. 21, 2018.
Notice of Allowance issued in related U.S. Appl. No. 15/851,671, dated Apr. 9, 2019.

* cited by examiner

US 11,081,445 B2

SEMICONDUCTOR DEVICE COMPRISING AIR GAPS HAVING DIFFERENT CONFIGURATIONS

RELATED APPLICATION

This application is a Continuation Application of U.S. Ser. No. 15/851,671, now U.S. Pat. No. 10,361,156, which is a Divisional Application of U.S. Ser. No. 15/178,115 filed on Jun. 9, 2016, now U.S. Pat. No. 9,881,870, which claims the priority of U.S. Provisional Application No. 62/273,382 filed on Dec. 30, 2015, the entire contents of which applications are incorporated herein by reference.

TECHNICAL FIELD

The disclosure relates to a semiconductor integrated circuit, more particularly to a semiconductor device having air gaps between metal wirings and its manufacturing process.

BACKGROUND

As the semiconductor industry introduces new generations of integrated circuits (ICs) having higher performance and greater functionality, the density of the elements that form the ICs is increased, while the dimensions and spacing between components or elements of the ICs are reduced, which causes a variety of problems. For example, for any two adjacent conductive features, when the distance between the conductive features decreases, the resulting capacitance (parasitic capacitance) increases. The increased capacitance results in an increase of power consumption and an increase in the resistive-capacitive (RC) time constant, i.e., an increase of signal delays. The capacitance between two adjacent conductive features (e.g., metal wirings) is a function of the dielectric constant (k value) of an insulating material filled in the space between the conductive features (also, a function of a distance between the conductive features and a size of the side surfaces of the conductive features). Therefore, the continual improvement in semiconductor IC performance and functionality is dependent upon developing insulating (dielectric) materials with low k values. Since the substance with the lowest dielectric constant is air (k=1.0), air-gaps are formed to further reduce the effective k value of metal wiring layers.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-8C are cross sectional views illustrating exemplary sequential processes for manufacturing a semiconductor device having air gaps according to one embodiment of the present disclosure. FIGS. 1-8C illustrate exemplary sequential processes for fabricating one of metal wiring layers (wiring levels), which are formed above a substrate. Although there are core structures, such as transistors or other elements (e.g., contacts etc.) constituting the semiconductor device (hereinafter referred to as "underlying structures") between the substrate and the metal wiring layers, detailed illustrations of such elements are omitted in FIGS. 1-8C for simplicity. The order of the processes may be changed.

Figure 1:
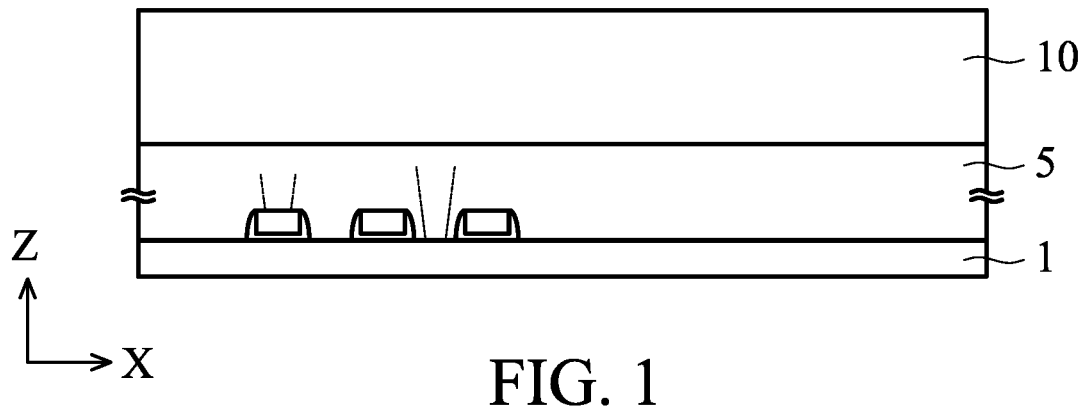
FIGS. 1, 2, 3, 4, 5A, 5B, 6, 7, 8A, 8B and 8C show exemplary sequential processes for manufacturing a semiconductor device having air gaps according to one embodiment of the present disclosure.

As shown in FIG. 1, a first interlayer dielectric (ILD) layer 10 is formed over the underlying structures 5 disposed over the substrate 1. An interlayer dielectric layer may also be called an inter-metal dielectric (IMD) layer. The first ILD layer 10 is made of, for example, one or more layers of low-k dielectric material. Low-k dielectric materials have a k-value (dielectric constant) lower than about 4.0. Some low-k dielectric materials have a k-value lower than about 3.5 and may have a k-value lower than about 2.5.

The materials for the first ILD layer 10 include compounds formed of elements of Si, O, C and/or H, such as SiCOH and SiOC. Organic materials, such as polymers may be used for the first ILD layer 10. For example, the first ILD layer 10 is made of one or more layers of a carbon-containing material, organo-silicate glass, a porogen-containing material, and/or combinations thereof. Nitrogen may also be included in the first ILD layer 10. The first ILD layer 10 may be a porous layer. The density of the first ILD layer 10 is less than about 3 g/cm³ in one embodiment and may be less than about 2.5 g/cm³ in other embodiments. The first ILD layer 10 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

In some embodiments, the first ILD layer may include an inter-layer insulating film and an inter-wire insulating film such that the metal wirings will be formed mainly in the inter-metal insulating film. The inter-layer insulating film may include a SiOC film and the inter-wire insulating film may include a TEOS (tetraethylorthosilicate) film.

Figure 2:
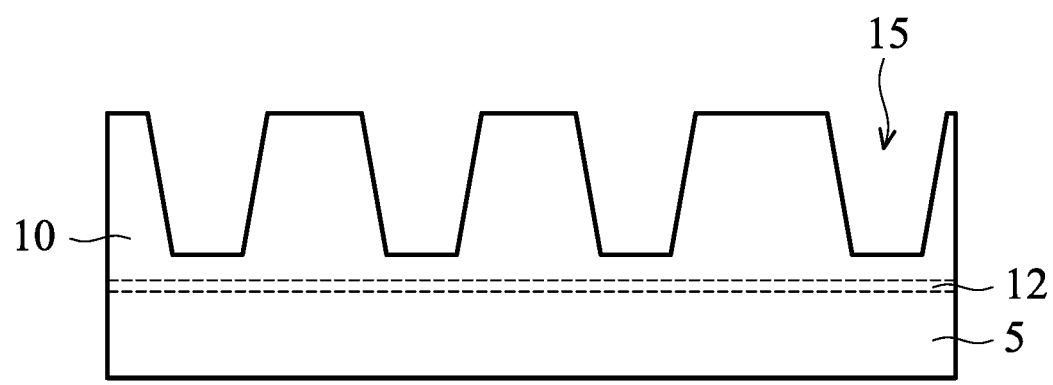

As shown in FIG. 2, first recesses 15 are formed in the first ILD layer 10 by using patterning operations including lithography and etching processes. In some embodiments, one or more via holes (contact holes) (not shown) to be connected to one or more elements of the underlying structures are formed at the bottom of the first recesses.

In some embodiments, a first etch-stop layer 12 is formed between the underlying structure 5 and the first ILD layer 10. The depth of the recesses 15 may be controlled by controlling an etching time or an etching rate of the recess etching.

Figure 3:
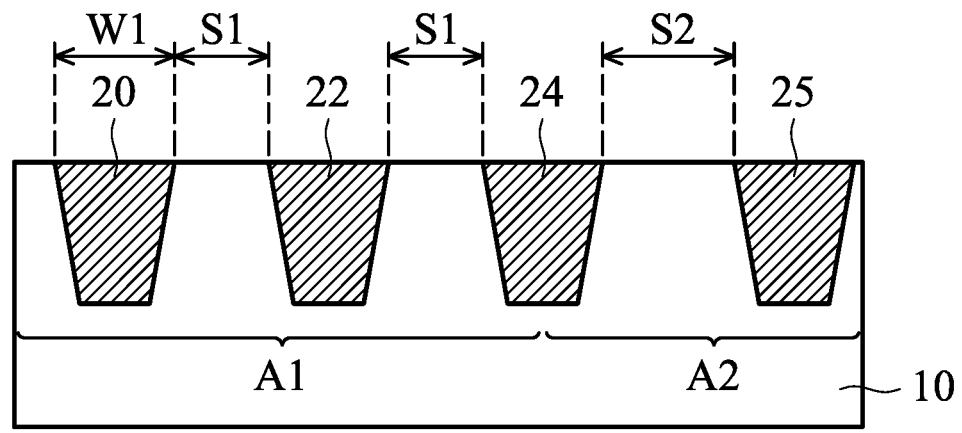

As shown in FIG. 3, a metal material is formed in the first recesses to form metal wirings 20, 22, 24 and 25. The operations to form the metal wirings include a damascene process. In the damascene process, one or more layers of metal material are formed in the first recesses 15 and the upper surface of the first ILD layer 10, and a planarization operation such as a chemical mechanical polishing method and/or a etch-back method is performed to remove portions of the metal material formed on the upper surface of the first ILD layer 10.

Figure 10:
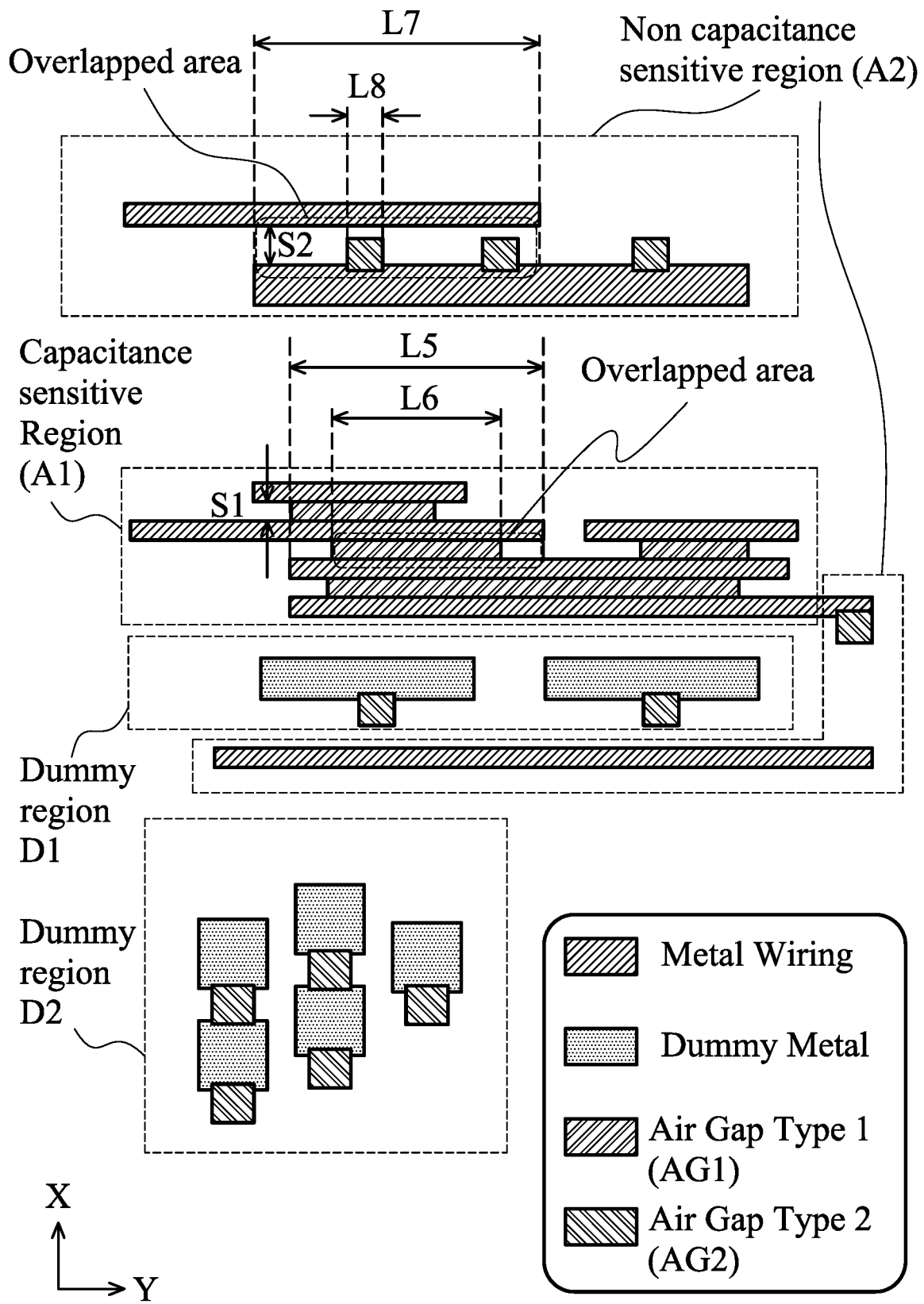
FIG. 10 shows an exemplary layout of a semiconductor device having air gaps according to one embodiment of the present disclosure.

As shown in FIG. 3, the semiconductor device of the present embodiment includes a capacitance sensitive region A1 and a non-capacitance sensitive region A2 (see, also FIG. 10). In the capacitance sensitive region A1, the metal wirings 20, 22 and 24 are arranged with a space S1 in between, and in the non-capacitance sensitive region A2, the metal wirings 24 and 25 are arranged with a space S2 in between, where S2>S1. In FIG. 3, the wiring 24 belongs to the capacitance sensitive region A1 and the non-capacitance sensitive region A2 for the purpose of this disclosure. In other embodiments, the capacitance sensitive region A1 and the non-capacitance sensitive region A2 are not adjacent to each other and do not share the same wiring. The metal wiring 25 in the non-capacitance sensitive region A2 may be a dummy metal wiring, which is not a part of a functioning circuit.

In one embodiment, the space S1 is the minimum space Smin for the metal wirings in this layer, which is defined by the design rule. In other words, no two metal wirings in the same wiring layer are arranged with a space smaller than Smin within one semiconductor device. Generally one minimum space Smin value for one metal wiring layer is defined within one semiconductor device, and the value of Smin may be different in other wiring layers or in other devices.

In some embodiments, S1 is in a range from about 10 nm to about 38 nm. Further, in the capacitance sensitive region A1, the line width W1 of the metal wirings is substantially the same as S1, in some embodiments. In the capacitance sensitive region A1, since the space between two adjacent metal wirings is very small, a parasitic capacitance between the metal wirings should be reduced by forming an air gap. In other embodiments, the capacitance sensitive region A1 is defined as a region in which metal wirings are arranged with S1, where Smin≤S1<αSmin (1<α<3, for example, 1.2, 1.5, 1.75, 2.0, 2.5, etc.).

In contrast, in the non-capacitance sensitive region A2, the space S2 between adjacent metal wirings is set larger than S1. The space S2 varies within one semiconductor device depending on, for example, the location and function of the metal wirings. In one embodiment, the space S2 is simply greater than S1. In certain embodiments, when S1=Smin, S2 is greater than Smin, and when Smin≤S1<αSmin, S2 is equal to or greater than αSmin. In other embodiments, Smin≤S1≤αSmin and S1<S2.

The one or more layers of metal material for the metal wirings 20, 22, 24 and 25 are formed by CVD, physical vapor deposition (PVD) and/or electro-plating.

The metal material for the metal wirings is one or more layers of Al, Cu, Co, Mn, W, Ti, Ta, TiN, TaN, TiW, WN, TiAl, TiAlN, TaC, TaCN and TiSiN. For example, the metal wirings may include a barrier layer made of, for example, TiN and/or TaN, and a body layer made of, for example, Cu or Cu-based materials. The metal wiring structure may be made by a damascene process.

Figure 4:
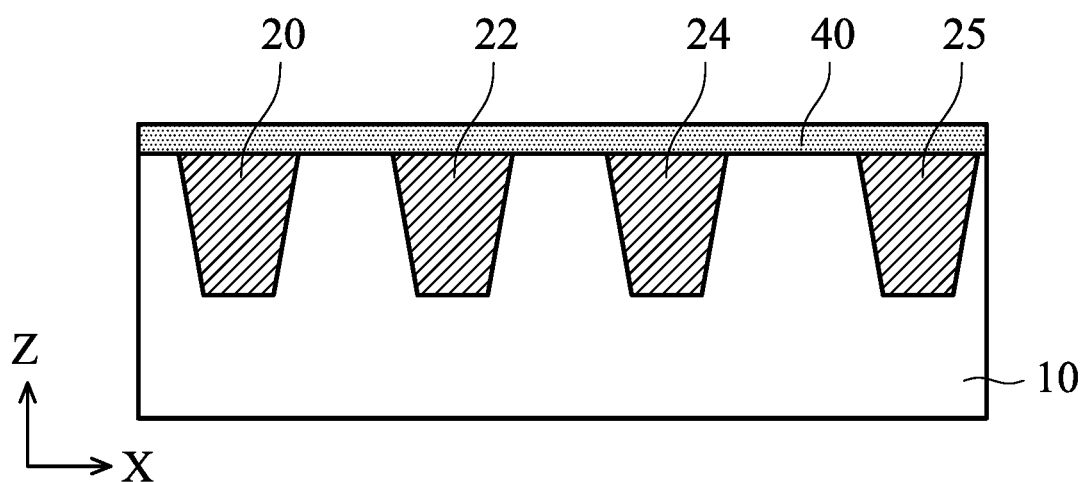

After forming the metal wirings 20, 22, 24 and 25, a second etch-stop layer 40 is formed over the metal wirings, as shown in FIG. 4. The second etch-stop layer 40 functions as an etching mask layer in a subsequent etching of the first ILD layer 10. The second etch-stop layer 40 includes one or more layers of a Si-based insulating material containing Si with O, N, C, B and or H, or an Al-based insulating material containing Al with O, N, C, B and or H. Examples of the second etch-stop layer include SiN, SiCO, SiCN, and SiCON.

The thickness of the second etch-stop layer 40 is in a range of about 1 nm to about 40 nm in some embodiments, and is in a range of about 5 nm to about 20 nm in other embodiments. The density of the second etch-stop layer 40 is less than about 3 g/cm³ in one embodiment and is less than about 2.5 g/cm³ in other embodiments.

The second etch-stop layer 40 may be formed by using, for example, PECVD, LPCVD, ALCVD, and/or a spin-on technology. In case of PECVD, the second etch-stop layer 40 is deposited at a substrate temperature in a range of about 25° C. to about 400° C. and at a pressure of less than 100 Torr.

After the formation of the second etch-stop layer 40, second recesses 25A, 25B and 25C are formed in the first ILD layer 10 between the first wiring 20 and the second wiring 22, between the second wiring 22 and the third wiring 24, and between the third wiring 24 and the fourth wiring 25, as shown in FIGS. 5A-7.

Figure 5A:
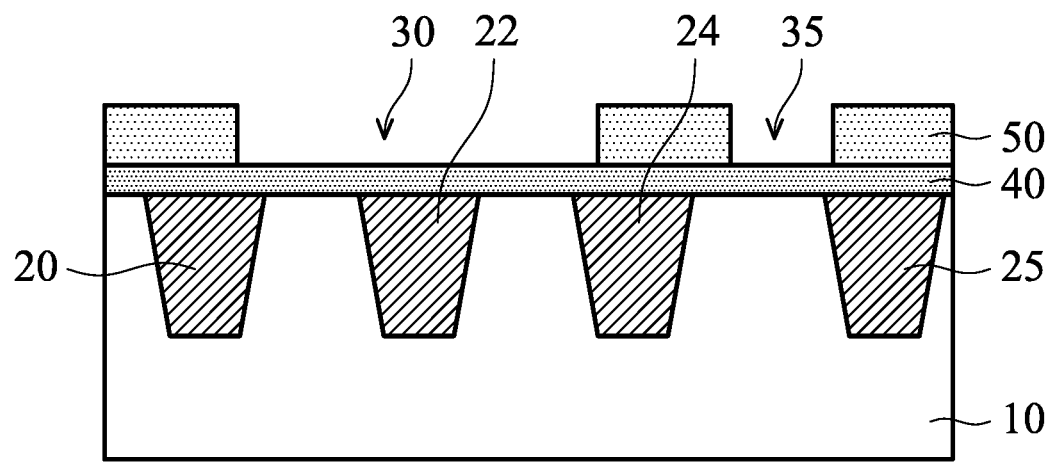

The second recesses 25A-25C are formed in the first ILD layer 10 by using patterning operations including lithography and etching processes. As shown in FIG. 5A, a mask layer 50, for example, a resist mask or a hard mask, is formed on the second etch-stop layer 40, and openings 30 and 35 are formed by a lithography process.

Figure 5B:
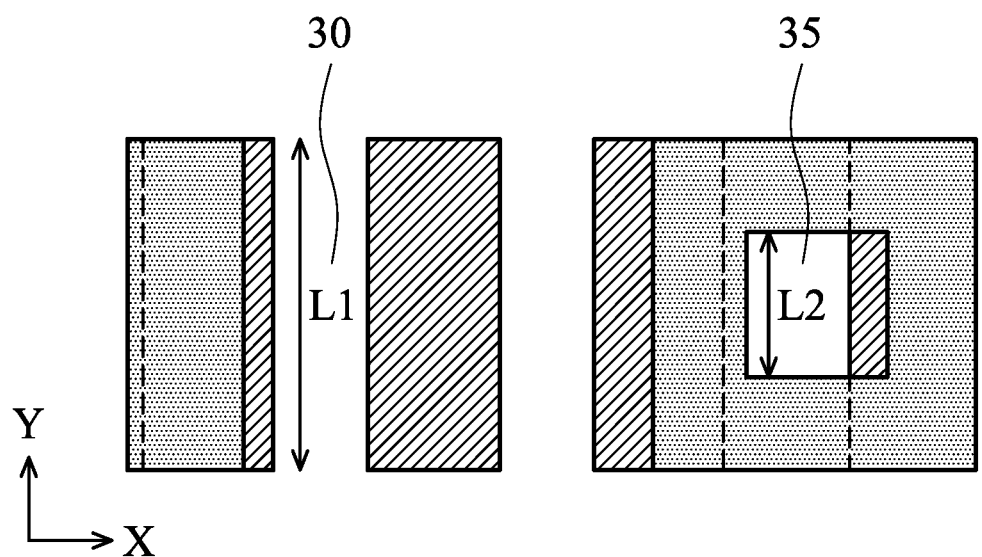

In one embodiment, the first opening 30 overlaps at least two metal wirings in plan view. In FIG. 5B, the first opening 30 overlaps three metal wirings in plan view. In some embodiments, the first opening 30 overlaps more than three metal wirings. The second opening 35 overlaps only one metal wiring in plan view, as shown in FIG. 5B.

In FIG. 5B, the metal wirings extend in the Y direction. The length L1 of the first opening 30 along the Y direction is greater than the length L2 of the second opening 35 along the Y direction.

Figure 6:
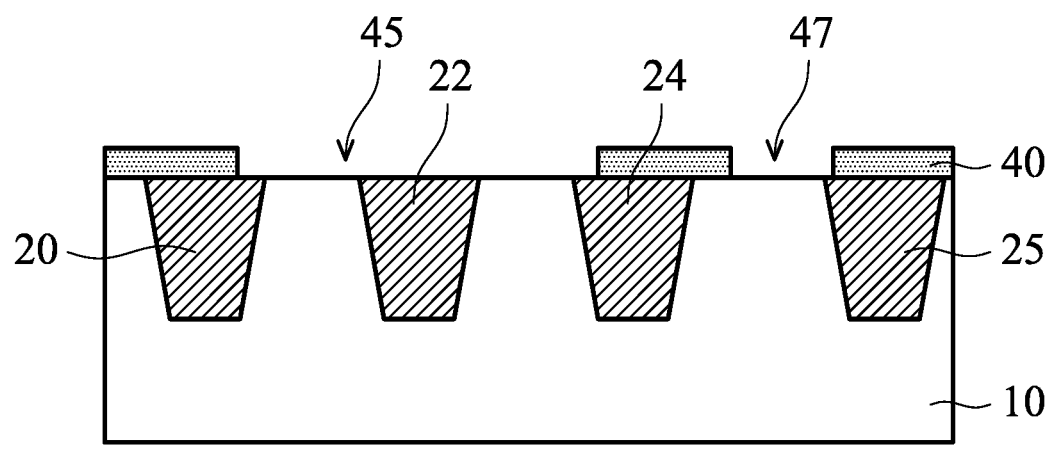
Figure 7:
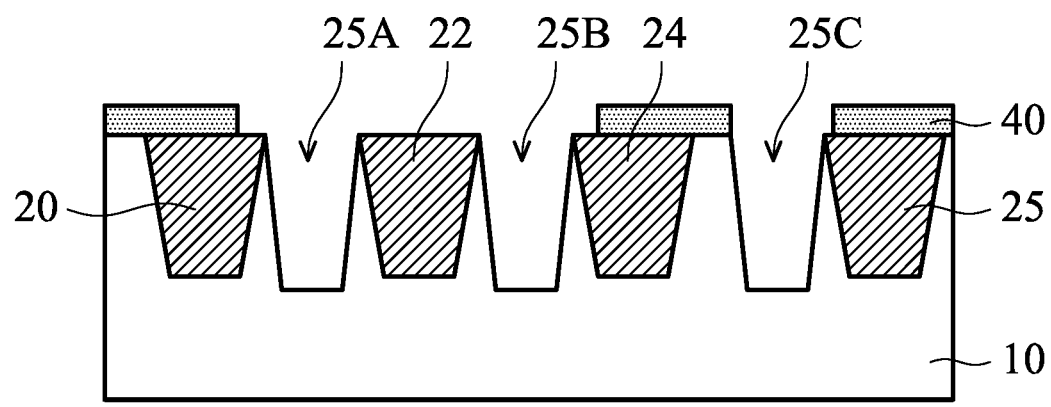

Then, by using dry etching and/or wet etching, the second etch-stop layer 40 is patterned to make openings 45 and 47, as shown in FIG. 6. The first ILD layer 10 under the openings 45 and 47 is subsequently etched to form the second recesses 25A-25C, as shown in FIG. 7. Since this etching mainly etches the first ILD layer 10, and the metal material for the wiring layers is not substantially etched, the second recesses 25A and 25B are formed self-aligned besides the second wirings 20, 22 and 24. The depth of the second recesses may be at the same level as the bottoms of the metal wirings or may be deeper than the bottoms of the metal wirings. The dry etching to form the second recesses 25A and 25B utilizes gases containing fluorine (F) and/or chlorine (Cl) in some embodiments. After the dry etching, a wet cleaning operation followed by a baking operation is performed, in some embodiments.

As shown in FIG. 7, an upper opening portion of the second recesses 25A or 25B is defined by the adjacent two metal wirings 20 and 22 or 22 and 24, respectively. An upper opening portion of the second recess 25C is defined by one of the adjacent two metal wirings (24 or 25), and the second etch-stop layer 40.

Figure 8A:
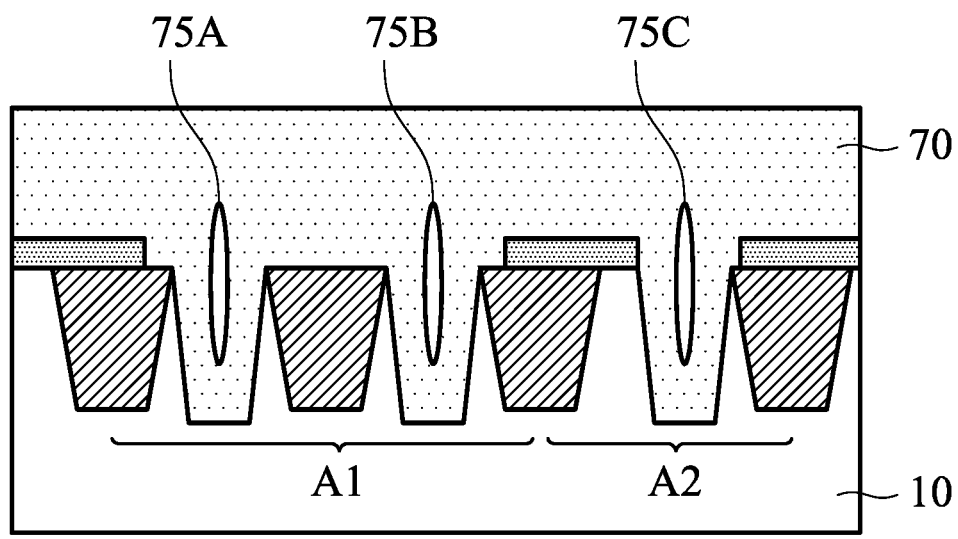

After forming the second recesses 25A-25C, as shown in FIG. 8A, a second ILD layer 70 is formed over the structure of FIG. 7. Air gaps 75A, 75B and 75C are formed in the second recesses 25A, 25B and 25C, respectively, as shown in FIG. 8A. As shown in FIG. 8A, the air gaps 75A, 75B and 75C are partially disposed in the second recesses 25A, 25B and 25C, respectively.

To form air gaps, non-conformal CVD method with a low step coverage condition may be utilized. By using non-conformal CVD, the upper portions of the second ILD layer "pinch-off" (are connected) before the second recesses are fully filled with the insulating material of the second ILD layer, thereby forming air gaps in the second recesses.

The second ILD layer 70 may include one or more layers of silicon oxide, silicon oxynitride (SiON), SiCN, SiOC or SiOCN, or low-k material. The second ILD layer 70 may be doped with, for example, phosphorous, to enhance its void formation effects.

In the above embodiment, the first ILD layer and the metal wirings are formed just above the underlying core structures. However, the first ILD layer and the metal wiring layers may be formed in one or more upper layers.

Figure 8B:
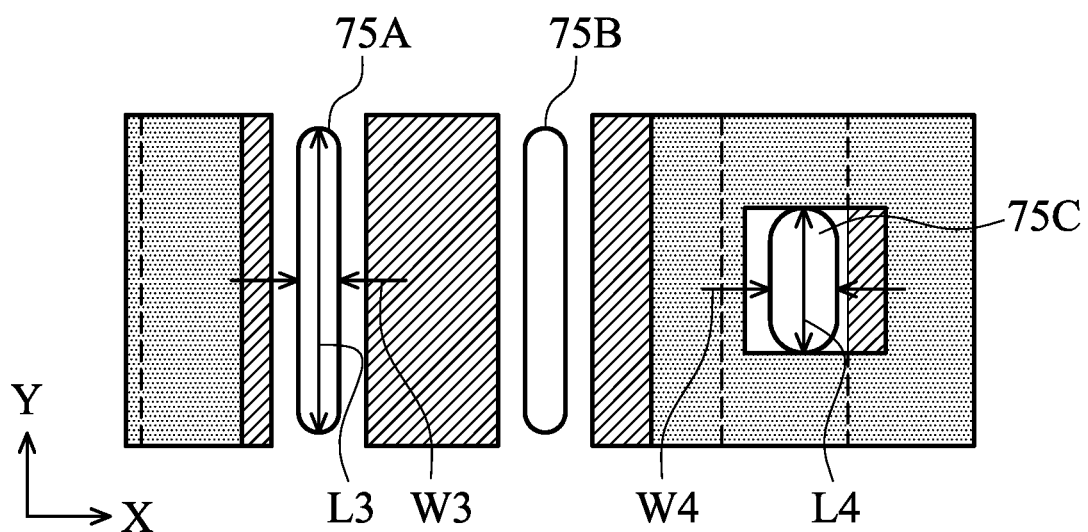

FIG. 8B shows a plan view of FIG. 8A. In FIG. 8B, only the metal wirings, the second etching stop layer 40 and air gaps 75A-75C are illustrated. The air gap 75A formed in the capacitance sensitive region A1 has a longer-side length L3 along the Y direction and a shorter-side width W3 along the X direction. Similarly, the air gap 75C formed in the non-capacitance sensitive region A2 has a longer-side length L4 along the Y direction and a shorter-side width W4 along the X direction. The lengths and widths L3, L4, W3 and W4 are respectively maximum length and width along the respective directions in plan view. A ratio R1 of the longer-side length L3 and the shorter-side width W3 of the air gap 75A is greater than a ratio R2 of the longer-side length L4 and the shorter-side width W4 of the air gap 75C in some embodiments. In certain embodiments, the ratio R1 is greater than about 5, and the ratio R2 is about 0.5 to about 2. In other embodiments, the ratio R1 is greater than about 10. The ratio R1 may be less than about 50 or less than about 100.

Figure 8C:
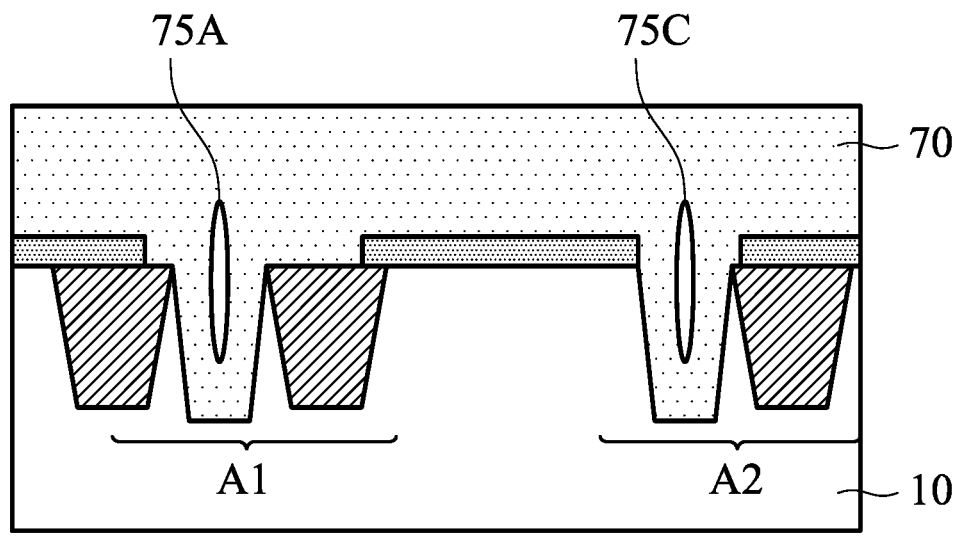

FIG. 8C shows an embodiment where the capacitance sensitive region A1 and the non-capacitance sensitive region A2 are not adjacent to each other.

As shown in FIGS. 8A and 8B, an air gap (75C) is formed in the non-capacitance sensitive region A2. As set forth above, the capacitance sensitive region A1 requires air gaps between adjacent metal wirings to reduce parasitic capacitance. In contrast, the non-capacitance sensitive region A2 does not necessarily require air gaps. However, placing air gaps in the non-capacitance sensitive region A2 shows the effects as set forth below.

Figure 9:
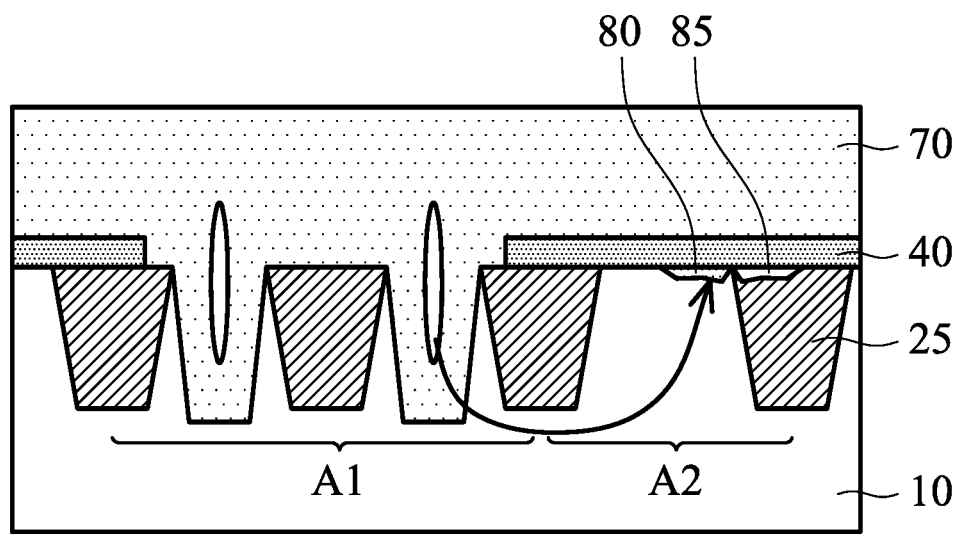
FIG. 9 shows a comparative example of a semiconductor device having air gaps.

FIG. 9 shows a comparative example of a semiconductor device, in which the capacitance sensitive region A1 includes air gaps, while the non-capacitance sensitive region A2 includes no air gap. During the formation of the second recesses as set forth above, moisture originating from the wet cleaning operation may accumulate in the second recesses, and such moisture may diffuse into the first ILD layer 10. Further, the diffused moisture may accumulate under the second etch-stop layer 40, in particular, in the non-capacitance sensitive region A2, as shown in FIG. 9. Although the baking operation is performed, the second etch-stop layer 40 prevents the moisture from being released from the first ILD layer 10. The accumulated moisture 80 may cause metal erosion 85 of the metal component forming the metal wiring 25.

In contrast, as shown in FIGS. 8A-8C, since the second recess 25C for the air gap 75C is formed in the non-capacitance sensitive region A2, the moisture can be released from the first ILD layer 10 through the recess 25C for the air gap 75C during a baking operation after the wet cleaning operation, which can suppress the erosion of the metal wiring 25. It is noted that, since the capacitance sensitive region A1 includes recesses and/or air gaps, the problem illustrated in FIG. 9 would not occur.

In some embodiments, in the non-capacitance sensitive region A2, the opening 47 and the recess 25C are formed, but no air gap is formed. For example, when the size of opening 47 is larger than a critical size (e.g., 1.75×Smin), the recess 25C is fully filled by the second ILD layer 70 and no air gap is formed. In such a case, however, the aforementioned effects (releasing the moisture) can be obtained.

FIG. 10 shows an exemplary layout of a semiconductor device having air gaps according to one embodiment of the present disclosure.

The layout design of FIG. 10 includes a capacitance sensitive region A1, a non-capacitance sensitive region A2, a first dummy region D1 and a second dummy region D2.

As set forth above, the capacitance sensitive region A1 includes metal wiring patterns arranged with the space S1 and the first type air gap patterns AG1, which correspond to the air gaps 75A and 75B of FIGS. 8A-8C. The non-capacitance sensitive region A2 includes metal wiring patterns arranged with the space S2 therebetween and the second type air gap patterns AG2, which correspond to the air gap 75C of FIGS. 8A-8C. The first dummy region D1 includes dummy metal wiring patterns and may also include metal wiring patterns. The second dummy region D2 includes dummy metal wiring patterns and no metal wiring patterns. The second type air gap patterns are arranged in the first dummy region D1 and the second dummy region D2.

Similar to the non-capacitance sensitive region A2, parasitic capacitances between metal wirings (metal wirings and dummy metal wirings) in the first dummy region D1 and the second dummy region D2 do not affect the circuit performance, and thus no air gap to reduce the parasitic capacitance is necessary in the first dummy region D1 and the second dummy region D2. However, by placing air gaps in the first dummy region D1 and the second dummy region D2, the aforementioned effects (e.g., prevention of metal erosion) can also be obtained.

As shown in FIG. 10, the metal wiring patterns in the capacitance sensitive region A1 and the first type air gap patterns AG1 extend in the Y direction. The first type air gap patterns AG1 are placed between the metal wiring patterns. Of course, there are other metal wiring patterns and first type air gap patterns extend in the X direction in the semiconductor device.

The second type air gap patterns AG2 have a square shape in one embodiment. As shown in FIG. 10, the second type air gap patterns AG2 are arranged so as to slightly overlap at last one metal wiring pattern or dummy metal pattern. In the second dummy region D2, the second type air gap patterns AG2 are arranged so as to slightly overlap two adjacent dummy metal patterns.

In the capacitance sensitive region A1, the length L6 of the first air gap pattern along the Y direction is more than about 70% of the length L5, where L5 is an overlap length of the adjacent two metal wiring patterns as seen along the X direction. As shown in FIG. 10, the first air gap pattern is one continuous pattern in the overlapped area defined by L5. In the non-capacitance sensitive region A2, the length L8 of the second air gap pattern along the Y direction is less than about 20% of the length L7, where L7 is an overlap length of the adjacent two metal wiring patterns as seen along the X direction. As shown in FIG. 10, two or more second air gap patterns are disposed in the overlapped area defined by L7 in some embodiments.

Figure 11:
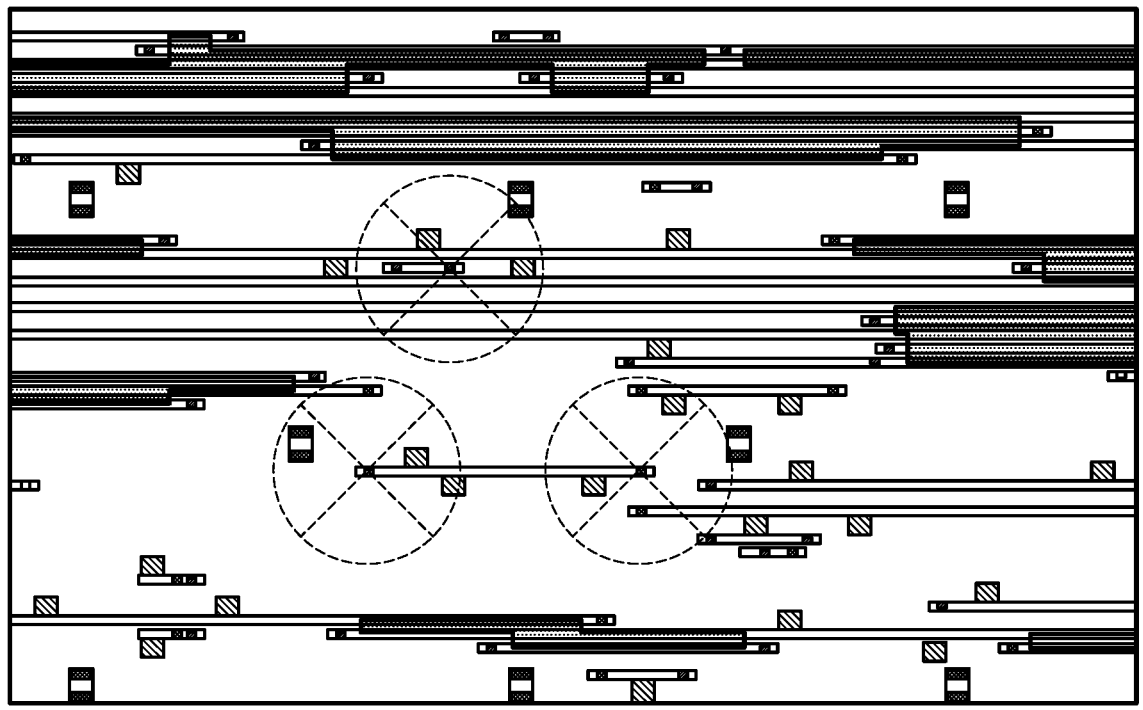
FIG. 11 shows an exemplary layout illustrating placing air gap patterns according to one embodiment of the present disclosure.
Figure 11:
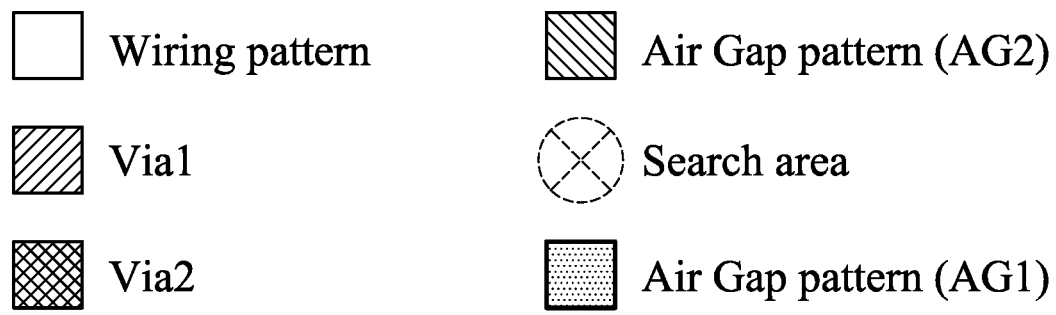

It is noted that as shown in FIG. 11, the first air gap patterns may be merged in the X direction into one air gap pattern. Further, the air gaps formed in the semiconductor device have substantially the same dimensional relationship as set forth above. That is, in the capacitance sensitive region A1, the length of the air gap along the longer side direction is more than about 70% of the overlap length (along the longer side direction) of the adjacent two metal wiring patterns as seen along the X direction. In the non-capacitance sensitive region A2, the length of the air gap along the same direction as the longer side direction is in a less than about 20% of the overlap length of the adjacent two metal wiring patterns as seen along the X direction, and two or more air gaps are disposed in the overlapped area.

Figure 12:
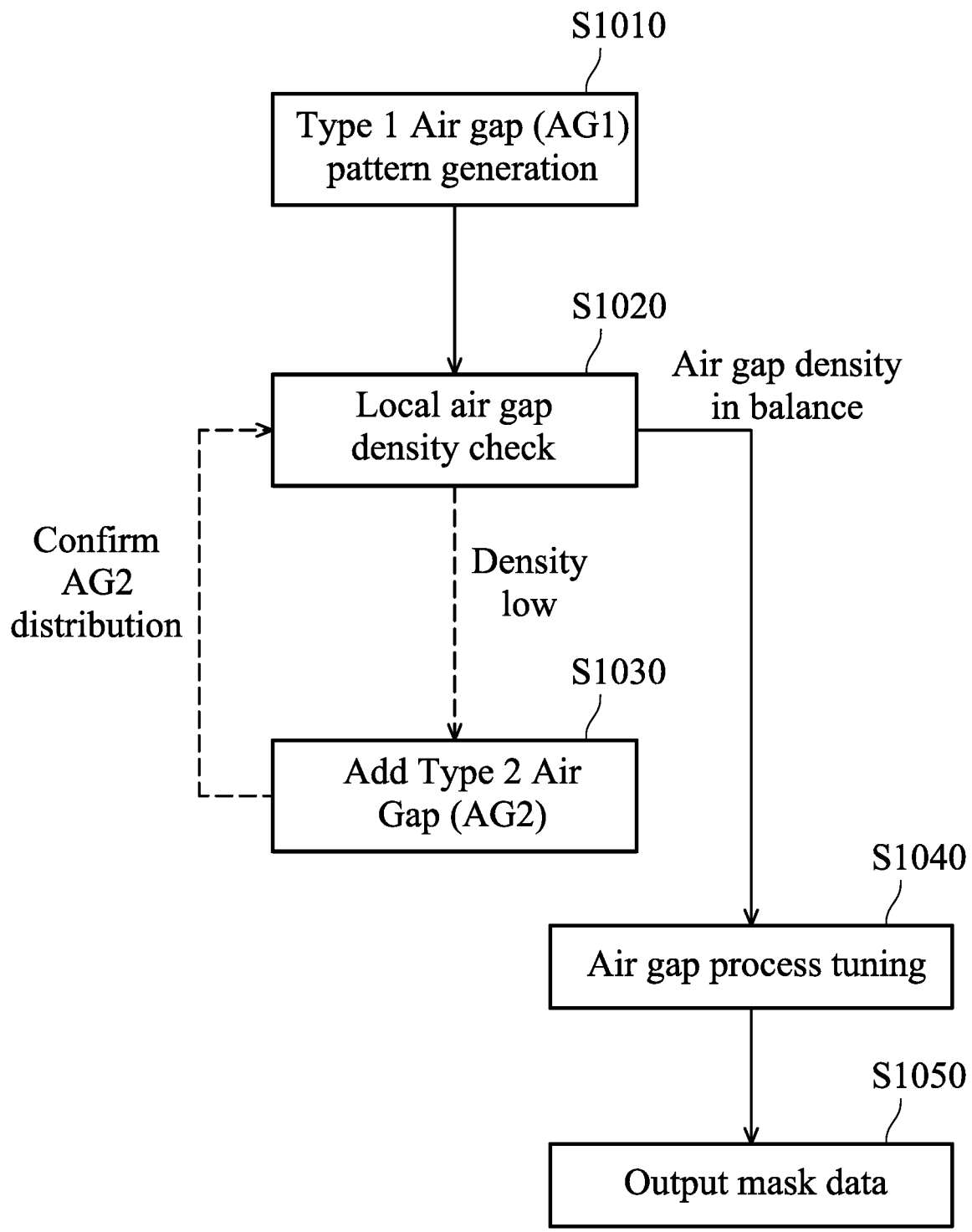
FIG. 12 is an exemplary flow chart showing the placing of air gap patterns according to one embodiment of the present disclosure.

FIG. 11 shows an exemplary layout illustrating the placing of air gap patterns according to one embodiment of the present disclosure. FIG. 12 is an exemplary flow chart showing the placing of air gap patterns according to one embodiment of the present disclosure. The operation flow shown by FIG. 12 is performed by a computer-aided-design (CAD) tool or an electronic design automation (EDA) tool using a computer. Such a computer includes a non-transitory memory, such as a hard disk, storing a CAD program, and the computer executes the CAD program performs the process flow of FIG. 12.

After metal wiring patterns and lower via patterns Vial (to connect the metal wirings to lower layer structures) and upper via patterns Vial (to connect the metal wirings to upper layer structures) are arranged, in S1010, first type air gap patterns are placed. To find the locations at which the first type air gap patterns are placed (i.e., the capacitance sensitive region), the CAD computer searches metal wiring patterns arranged with the search space, e.g., S1. Then, first type air gap patterns having appropriate shapes are placed.

In S1020, the CAD computer checks a local air gap density. In this operation, the CAD computer locates one via from plural vias (upper vias or lower vias), and determines whether any first air gap pattern is included in a search area within a distance R1 from the via. In some embodiments, the distance R1 is set within about 0.5 µm to 2 µm. In one embodiment, the distance R is set at 1 µm.

If the CAD computer finds no first air gap pattern in the search area, the CAD computer places at least one second air gap pattern to partially overlap wiring pattern located in the search area (S1030). In some embodiments, at least two second air gap patterns are placed. Then, the CAD computer locates a next via, and performs S1020 and S1030. After all vias are checked, additional tuning may be performed (S1040). Subsequently, the CAD computer outputs a photo mask design data in a binary format (S1050). The photo mask design data include data for the first air gap patterns and the second air gap patterns. The binary format may be the GDSII standard format.

The various embodiments or examples described herein offer several advantages over the existing art. For example, in the present disclosure, by placing air gaps in the non-capacitance sensitive regions (and dummy regions), it is possible to release the moisture contamination in the first ILD layer from a wet cleaning operation, thereby suppressing erosion of the metal wirings. Thus, it is possible to improve reliability of the device.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a first interlayer dielectric layer is formed over a substrate. First recesses are formed in the first interlayer dielectric layer. Metal wirings are formed in the first recesses. A mask layer is formed over the metal wirings and the first interlayer dielectric layer. A first opening and a second opening are formed by patterning the mask layer. A first groove corresponding to the first opening and a second groove corresponding to the second opening are formed by etching the first interlayer dielectric layer. A second interlayer dielectric layer is formed so that a first air gap is formed in the first groove and a second air gap is formed in the second groove. The metal wirings are arranged with a first space or a second space between the metal wirings, the second space having a greater length than the first space. No adjacent two metal wirings are arranged with a space smaller than the first space. The first air gap is formed in a first area sandwiched by adjacent two metal wirings arranged with the first space. The second air gap is formed in a second area sandwiched by adjacent two metal wirings arranged with the second space.

In accordance with another aspect of the present disclosure, a semiconductor device includes a first interlayer dielectric layer disposed over a substrate, metal wirings, a second interlayer dielectric layer disposed over the first interlayer dielectric layer and the metal wirings, a first air gap and a second air gap. The metal wirings are embedded in the first interlayer dielectric layer, and arranged with a first space or a second space between the metal wirings. The second space has a greater length than the first space. The first air gap is formed by the second interlayer dielectric layer and formed in a first area sandwiched by adjacent two metal wirings arranged with the first space. The second air gap is formed by the second interlayer dielectric layer and formed in a second area sandwiched by adjacent two metal wirings arranged with the second space therebetween. No adjacent two metal wirings are arranged with a space smaller than the first space.

In accordance with another aspect of the present disclosure, in method for designing a layout structure of a semiconductor device by using a computer, first air gap patterns are arranged over first wiring patterns. One via is located from plural vias. Each of the plural vias overlaps at least one of first wiring patterns. It is determined whether any first air gap patterns are included in a search area within a search distance from the via. If no first air gap pattern is included in the search area, at least one second air gap pattern is arranged to partially overlap a first wiring pattern located in the search area. Photo mask design data in a binary format for the first air gap patterns and the second air gap patterns are output.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first region; and
a second region, wherein:
the first region includes first wirings, in a first wiring layer, arranged adjacent to each other with a space S1,
a first air gap is provided between the first wirings in a first groove formed in a first interlayer dielectric (ILD) layer, the first air gap being formed by a second ILD layer,
the second region includes, in the first wiring layer, second wirings arranged adjacent to each other with a space S2 larger than S1,
a second air gap is provided adjacent to one of the second wirings in a second groove formed in the first ILD, and
the second ILD forming the second air gap is in contact with no wiring at one side of the second air gap.

2. The semiconductor device of claim 1, wherein no adjacent two wirings are arranged with a space smaller than S1 in a first wiring layer.

3. The semiconductor device of claim 2, wherein:
the first wirings and the second wirings extend in a first direction, and
a length of the first air gap along the first direction is greater than a length of the second air gap along the first direction.

4. The semiconductor device of claim 2, wherein a center of the second air gap is closer to one of the adjacent second wirings than the other of the adjacent second wirings.

5. The semiconductor device of claim 4, wherein a width of the one of the adjacent second wirings is greater than a width of the other of the adjacent second wirings.

6. The semiconductor device of claim 1, wherein:
the first and second wirings extend in a first direction,
the adjacent first wirings face each other with a length L1 along the first direction, and
a length of the first air gap along the first direction is more than 70% of L1.

7. The semiconductor device of claim 1, wherein:
the first and second wirings extend in a first direction, the adjacent second wirings face each other with a length L2 along the first direction, and
a length of the second air gap along the first direction is less than 20% of L2.

8. The semiconductor device of claim 7, wherein, in the length L2 at which the adjacent second wirings face each other, two or more second air gaps are provided between the adjacent second wirings.

9. The semiconductor device of claim 1, wherein one of the adjacent second wirings is a dummy wiring.

10. The semiconductor device of claim 1, wherein both of the adjacent second wirings are dummy wirings.

11. The semiconductor device of claim 1, wherein the second region includes a third air gap facing only one wiring.

12. The semiconductor device of claim 2, wherein:
the first wirings and the second wirings extend in a first direction, and
a length of the first air gap along a second direction crossing the first direction is smaller than a length of the second air gap along the second direction.

13. A semiconductor device comprising:
a first interlayer dielectric layer disposed over a substrate;
metal wirings embedded in the first interlayer dielectric layer, the metal wirings being arranged with a first space or a second space between the metal wirings, the second space having a greater length than the first space;
a second interlayer dielectric layer disposed over the first interlayer dielectric layer and the metal wirings;
an etch-stop layer disposed between the first interlayer dielectric layer and the second interlayer dielectric layer;
a first air gap formed by the second interlayer dielectric layer and formed in a first area sandwiched by adjacent two metal wirings arranged with the first space; and
a second air gap formed by the second interlayer dielectric layer and formed in a second area sandwiched by adjacent two metal wirings arranged with the space more than the first space therebetween,
wherein no etch-stop layer is disposed over at least one of the metal wirings in the first area.

14. The semiconductor device of claim 13, wherein:
the metal wirings extend in a first direction, and
a length of the first air gap along the first direction is greater than a length of the second air gap along the first direction.

15. The semiconductor device of claim 14, wherein at least one of the adjacent two metal wirings of the second area is a dummy metal wiring.

16. The semiconductor device of claim 13, wherein:
the first air gap has a longer-side length along a first direction and a shorter-side width along a second direction perpendicular to the first direction in plan view,
the second air gap has a first side length along the first direction and a second-side length along the second direction in plan view, and
a ratio of the longer-side length and the shorter-side width of the first air gap is greater than a ratio of the first-side length and the second-side length of the second air gap.

17. The semiconductor device of claim 16, wherein:
the ratio of the longer-side length and the shorter-side width of the first air gap is greater than 5, and
the ratio of the first-side length and the second-side width of the second air gap is 0.5-2.

18. The semiconductor device of claim 13, further comprising a third insulating layer partially disposed between the metal wirings and the second interlayer dielectric layer.

19. The semiconductor device of claim 18, wherein:
the first air gap is at least partially disposed in a first recess formed by the first interlayer dielectric layer,
the second air gap is at least partially disposed in a second recess formed by the first interlayer dielectric layer,
an upper opening portion of the first recess is defined by the adjacent two metal wirings, and
an upper opening portion of the second recess is defined by one of the adjacent two metal wirings, and the third insulating layer.

20. A semiconductor device, comprising:
a first air gap provided between first wirings, in a first wiring layer, arranged adjacent to each other with a space S1;
a second air gap provided between second wirings, in the first wiring layer, arranged adjacent to each other with a space S2 larger than S1, wherein:
the first air gap has a longer-side length along a first direction and a shorter-side width along a second direction perpendicular to the first direction in plan view,
the second air gap has a first side length along the first direction and a second-side length along the second direction in plan view, and
a ratio of the longer-side length and the shorter-side width of the first air gap is greater than a ratio of the first-side length and the second-side length of the second air gap.

* * * * *